United States Patent
Wang et al.

(10) Patent No.: US 9,575,096 B2
(45) Date of Patent: Feb. 21, 2017

(54) SYSTEMS AND METHODS TO MONITOR CURRENT IN SWITCHING CONVERTERS

(71) Applicant: Maxim Integrated Products, Inc., San Jose, CA (US)

(72) Inventors: Jian Wang, Gilbert, AZ (US); Kevin Wendell Dowdy, Phoenix, AZ (US); Dale Alan Kemper, Gilbert, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 102 days.

(21) Appl. No.: 14/224,579

(22) Filed: Mar. 25, 2014

(65) Prior Publication Data

US 2015/0137782 A1 May 21, 2015

Related U.S. Application Data

(60) Provisional application No. 61/905,758, filed on Nov. 18, 213.

(51) Int. Cl.
| | |
|---|---|
| *G01R 19/00* | (2006.01) |
| *H02M 3/156* | (2006.01) |
| *H02M 1/00* | (2006.01) |
| *G01R 31/40* | (2014.01) |

(52) U.S. Cl.
CPC .......... *G01R 19/0092* (2013.01); *H02M 3/156* (2013.01); *G01R 31/40* (2013.01); *H02M 2001/0009* (2013.01)

(58) Field of Classification Search
CPC ........ H03L 7/093; H03L 3/00; G01R 19/0092; G01R 31/40
USPC .............................. 324/76.79, 521, 522, 713
See application file for complete search history.

(56) References Cited

U.S. PATENT DOCUMENTS

| | | | |
|---|---|---|---|
| 6,252,466 B1 * | 6/2001 | Kawamura | ........... H03L 7/0891 327/156 |
| 2002/0036486 A1 * | 3/2002 | Zhou | ......................... G05F 1/62 323/272 |
| 2005/0280406 A1 * | 12/2005 | Boerstler | ................ H03L 7/093 324/76.53 |

\* cited by examiner

*Primary Examiner* — Vincent Q Nguyen
(74) *Attorney, Agent, or Firm* — North Weber & Baugh LLP

(57) ABSTRACT

Various embodiments of the invention increase current monitoring accuracy in switching converters. In particular, certain embodiments of the invention allow reduce noise associated with transients that are typically generated at transitions when power FETs are turn on and off and allow to accurately sense inductor DC current of switching converters, thereby, increase current monitoring accuracy without requiring any blanking circuitry. In certain embodiments of the invention, this is accomplished by an acquisition circuit that dynamically monitors current in various operating modes. A phase frequency detector (PFD) and control circuit in the acquisition circuit automatically align a narrow sampling window and the midpoint of a turn-on signal. Certain embodiments utilize an analog multiplier circuit to sense current in skip mode operation.

20 Claims, 8 Drawing Sheets

SYSTEMS AND METHODS TO MONITOR CURRENT IN SWITCHING CONVERTERS

CROSS REFERENCE TO RELATED PATENT APPLICATIONS

This application claims priority to U.S. Provisional Application No. 61/905,758, titled "Systems and Methods to Monitor Current in Switching Converters," filed Nov. 18, 2013, by Jian Wang, Kevin Dowdy and Dale Kemper, which application is hereby incorporated herein by reference in its entirety.

BACKGROUND

A. Technical Field

The present invention relates to power conversion circuits and, more particularly, to systems, devices, and methods to monitor current in switching-type power conversion circuits that operate in CCM and DCM.

B. Background of the Invention

Electrical systems used in areas such as consumer electronics applications commonly employ switching power regulators to convert a voltage into another voltage that is suitable to operate various electrical devices within the system. Electronic switching-type regulators are particularly useful in reducing size and cost. They are operated mainly in one of two modes, continuous conduction mode (CCM) and discontinuous conduction mode (DCM), also known as skip mode. Generally, in CCM, the inductor current is always positive and does not change polarity, while in DCM the current flowing through the inductive element is set to zero in each cycle. Skip mode operation is a commonly used to enhance efficiency when the switching regulator operates with a fixed switching frequency under light load current conditions.

Oftentimes control circuitry measures and monitors the load current of the switching converter in real-time in order to obtain useful information about the currents flowing through electrical components connected to a given switching converter in a particular application. Numerous existing approaches to monitor current measure load current by sensing the current on one of multiple power FETs, converting it into a voltage signal, and filtering the signal in order to obtain an average DC voltage that is representative of the DC component of the sensed current. One major drawback with these approaches is that, particularly when measuring current in skip mode operation, the current is susceptible to noise caused by on and off switching transitions present in virtually all switching converters. The noise component of the resulting voltage signal can significantly degrade the accuracy of the detected voltage and, thus, negatively affect the accuracy of the current measurement. Existing designs usually require additional blanking circuitry to remove unwanted noise spikes, which limit the duty cycle range of the switching regulator. As a result, while switching converters that operate in CCM, i.e., under heavy load conditions, provide relatively accurate output signals, switching converters provide much less accurate results when operating in DCM.

What is needed are systems and methods that overcome the above-described limitations.

SUMMARY OF THE INVENTION

The disclosed systems and methods provide for accurate current monitoring in switching converters operating in CCM mode and DCM mode by employing an acquisition circuit that comprises a sample and hold circuit and a low-pass filter to control the sampling of at least one section of a waveform of a voltage that corresponds to a sensed current and is active during a turn-on signal. The acquisition circuit comprises a phase frequency detector and control logic that, in a non-active phase of a ramp voltage, generates a sampling window that is relatively narrower than the turn-on signal in order to reduce noise associated with transients that are commonly generated at transition events, such as the turning on and off of a power MOSFET device.

The acquisition circuit uses a negative feedback in a control loop configuration to adjust the midpoint of the sampling window with the midpoint of the turn-on signal. In certain embodiments, alignment is accomplished by aligning a falling edge of the turn-on signal with a falling edge of a second ramp voltage. Both ramping events are generated within the same cycle as the turn-on signal and are separated in time such as to allow the sampling window to be located between both ramping events. Due to the symmetry, if both ramps occur within the turn-on pulse, the dead time between the ramps and, therefore, the sampling window will align with the turn-on pulse.

In various embodiments, a low-pass filter network samples and averages aligned voltage signal to generate a DC value that represents the sensed current. Since midpoints are sampled sufficiently far away from switching transitions, the sampled voltage signals are practically noise-free and unaffected by transition noise.

In certain embodiments, in skip mode operation, a DC value sensed by the current monitor is scaled by a factor that is inversely proportional to the period of an asymmetrical waveform in order to account for dead times in the current, which otherwise would corrupt the accuracy of the current monitor output.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that this is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention. In this document open switching converter, switching regulator frame, and switching power regulator are used interchangeably.

Figure 1:
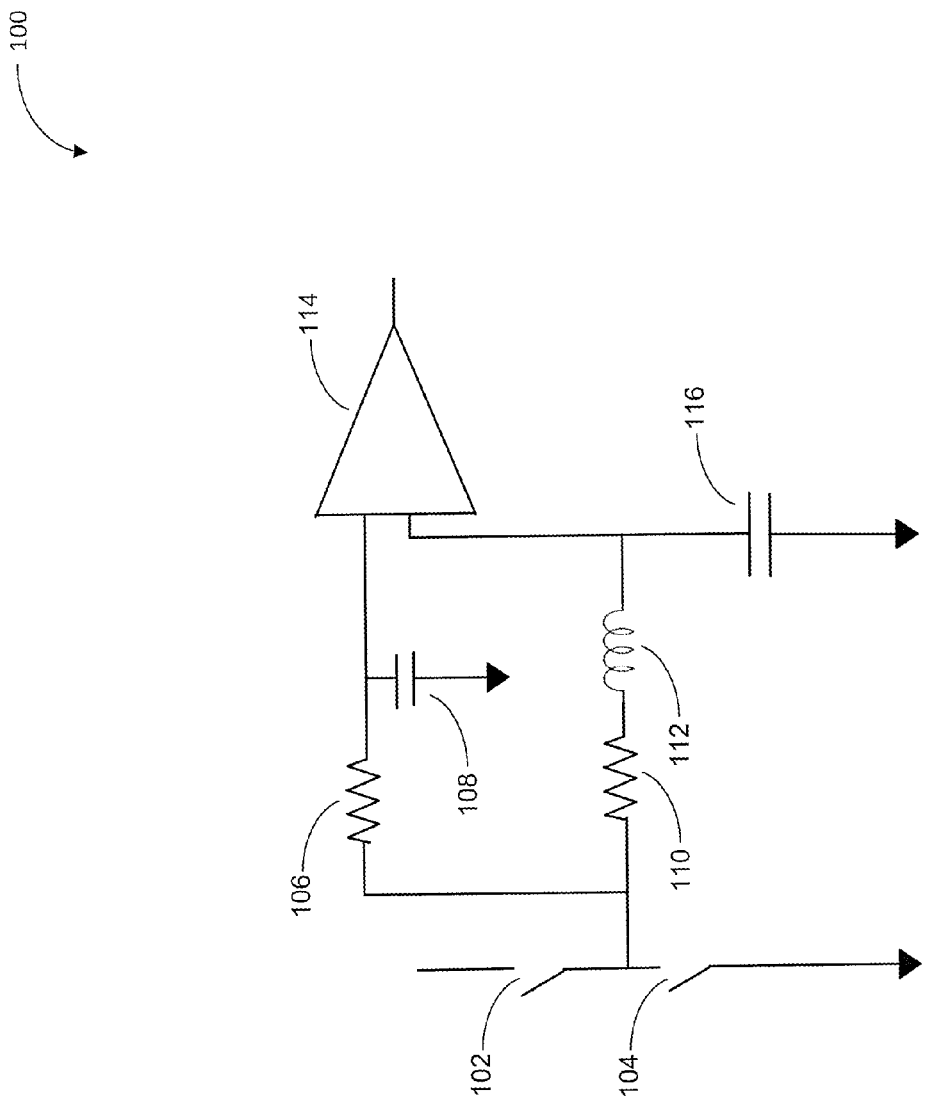
FIG. 1 is a prior art current monitor for use in switching converters.

FIG. 1 is a prior art current monitor for use in switching converters. Current monitoring circuit 100 comprises switch 102, 104, resistor 106, inductor 112, operational amplifier 114, and capacitor 108, 116. Switch 102, 104 in combination with inductor 112 form a buck converter that is coupled to output capacitor 116. Inductor 112 and output capacitor 116 are typically external components. Resistor 110 represents the DC resistance of inductor 112.

In operation, the voltage at the node between switches 102 and 104 is sensed and filtered by the RC filter arrangement consisting of resistor 106 and capacitor 108 in order to obtain a DC voltage that represents the DC current flowing through inductor 112. Assuming that the average voltage across inductor 112 is zero, and given that the resistance value of resistor 110 is known, then the DC current flowing through resistor 110 and, thus, through inductor 112 can be easily calculated by dividing the DC voltage across resistor 110 by the known value of resistor 110. Operational amplifier 114 amplifies the filtered and averaged voltage to generate an output DC voltage that is representative of the DC current flowing through inductor 112.

In effect, circuit 100 relies on the DC resistance 110 of inductor 112 to sense a DC component in the output voltage across output capacitor 116. However, up to 50% variance in the value of resistance 110 that is caused mainly by variations in operating temperature and by manufacturing tolerances of inductor 112 make this topology prone to errors under certain circumstances. Therefore, it would be desirable to have methods and systems that provide accurate current readings over a wide range of operation conditions.

Figure 2:
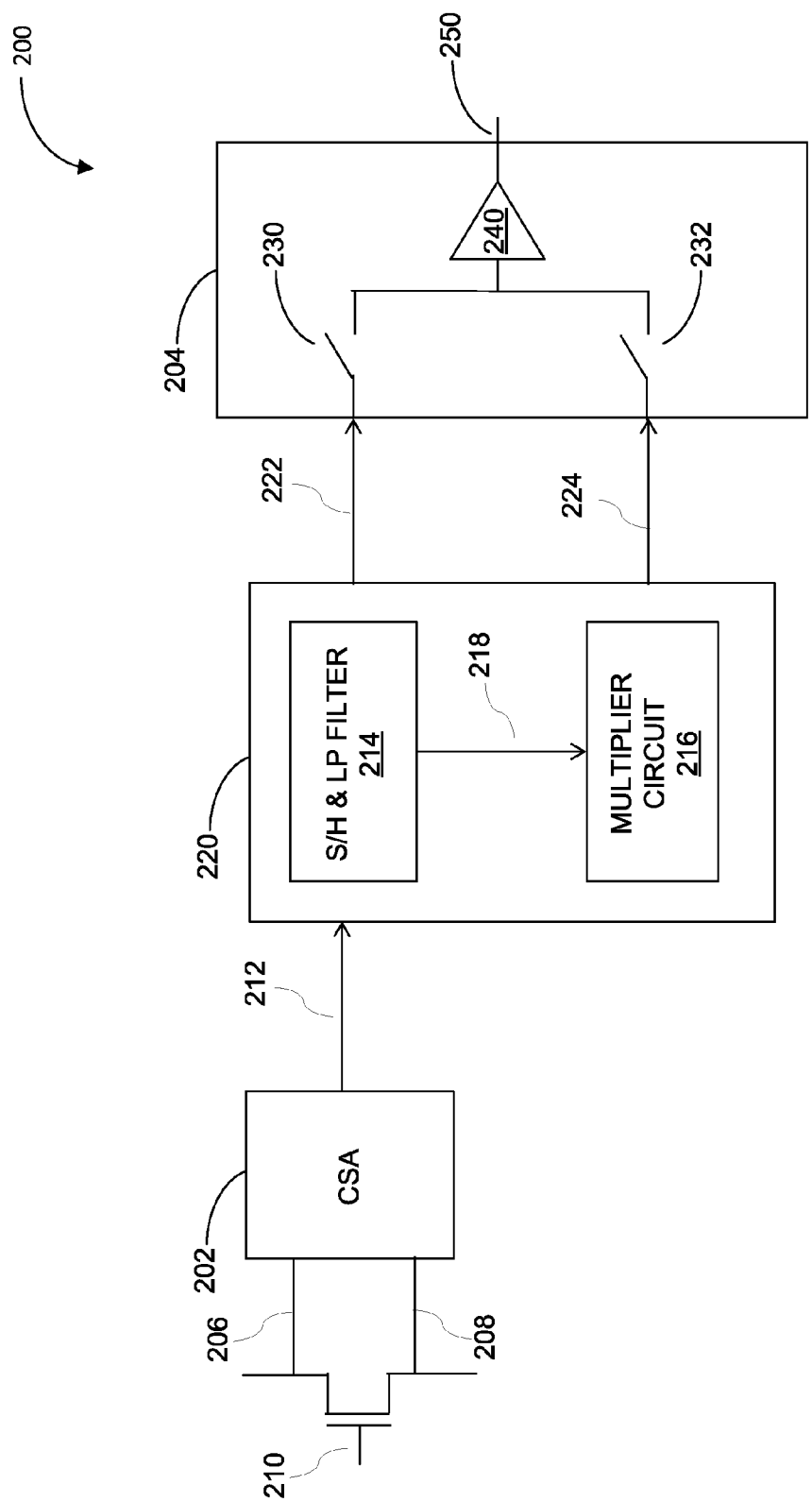
FIG. 2 illustrates a block diagram of a current monitoring system using an acquisition circuit according to various embodiments of the invention.

FIG. 2 illustrates a block diagram of a current monitoring system using an acquisition circuit according to various embodiments of the invention. Exemplary system 202 comprises three sub modules: 1) current sense amplifier (CSA) 202; 2) acquisition circuit 220, and 3) MUX & buffer circuit 204. Power MOSFET 210 is coupled to input 206, 208 of CSA 202. The output of CSA 202 is forwarded to sample and hold circuit 214 of acquisition circuit 220, which produces output signals 222 and 224 that are multiplexed and buffered by circuit 204. Output signal 250 generated by circuit 204 is representative of the DC current that is detected and amplified by CSA 202. Input ports 206, 208 of CSA 202 are coupled to drain and source terminals of n-channel power MOSFET 210, which, in this example, operates as a buck synchronous rectifier. However, this is not intended as a limitation as any suitable circuit may provide signal 212 to acquisition circuit 220.

Acquisition circuit 220 comprises sample and hold circuit 214, which further comprises a low-pass filter network as well as multiplier circuit 216. Sample and hold circuit 214 and multiplier circuit 216 are coupled to respective switches 230 and 232 of MUX & buffer circuit 204. In this example, buffer 240 is a rail-to-rail buffer with an input common mode range extending from a ground potential to a top rail supply voltage. Buffer 240 drives a small capacitive load (e.g, 15-30 pF), such as the input capacitance of an ADC (not shown in FIG. 2).

In operation, CSA 202 detects the current flowing through power MOSFET 210 and converts the detected current signal into a proportional voltage signal 212. Since voltage signal 212 tracks the waveform of the inductor current flowing through power FET 210, it is proportional to the inductor current that flows through power MOSFET 210. In this example, the waveform of voltage signal 212 tracks an inductor current that linearly ramps up and down, as shown in FIG. 3A and FIG. 3B.

Acquisition circuit 220 receives voltage signal 212 and detects the midpoint of at least one portion of the waveform of voltage signal 212. In one embodiment, the midpoint correlates to the midpoint of an external trigger signal, for example, a turn-on signal for power MOSFET 210. Detection of the midpoint is accomplished by producing a sampling window that is relatively narrower than the voltage waveform and aligning the sampling window in the middle of a selected section of the voltage waveform. Acquisition circuit 220 averages a plurality of midpoints to generate a DC value that is representative of voltage signal 212 and, thus, representative of the inductor current.

CSA 202 is configured to operate in one of two modes, CCM and DCM. In order to accurately monitor current in DCM, multiplier circuit 216 (e.g., a buck converter) is added to acquisition circuit 220. The averaged DC component of signal 212, signal 218, is multiplied by a factor of (Ton+Toff)/Ts, where Ton+Toff represents the sum of the on-time of both high side and low side power FET, and Ts is the period. As result of the multiplication, output signal 224 represents the correct average value and allows for precise current monitoring in DCM.

Figure 3A:
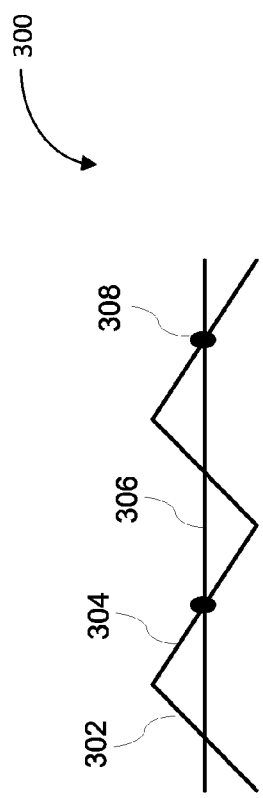
FIG. 3A is a waveform illustrating the general operation of the current monitoring system in FIG. 2 in CCM, according to various embodiments of the invention.
Figure 3B:
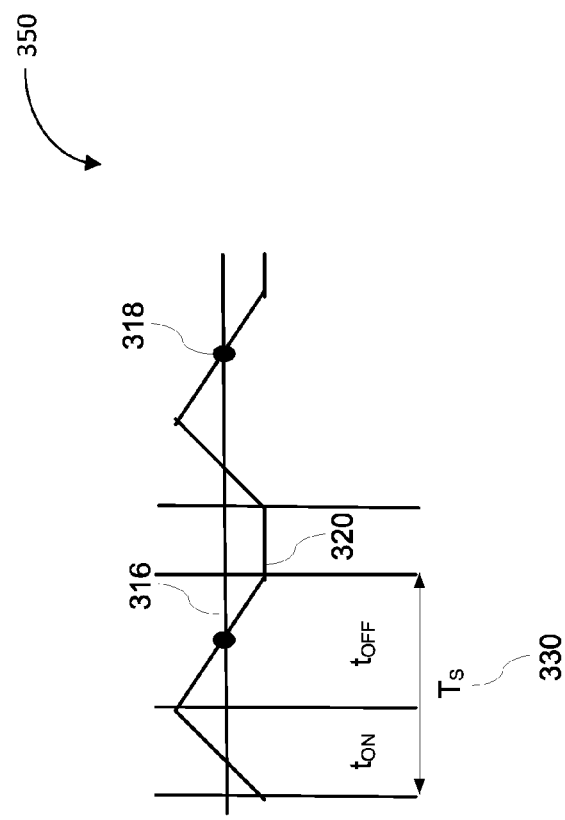
FIG. 3B is a waveform illustrating the general operation of the current monitoring system in FIG. 2 in DCM, according to various embodiments of the invention.

FIG. 3A is a waveform illustrating the general operation of the current monitoring system in FIG. 2 in CCM, according to various embodiments of the invention. FIG. 3B is a waveform illustrating the general operation of the current monitoring system in FIG. 2 in DCM, according to various embodiments of the invention. As shown in FIG. 3A, in CCM, triangular waveform 300 of the inductor current remains above a zero value, while in DCM mode in FIG. 3B the waveform reaches zero 320 at certain times within the cycle as indicated by the flat portion of waveform 350.

Returning to FIG. 2, in CCM, acquisition circuit 220 detects current by sampling output voltage signal 212 on the down-ramp portion of the waveform. The sampled value is processed by acquisition circuit 220. In one embodiment, acquisition circuit 220 is configured to sample output voltage signal 212 substantially at the midpoint of the downward slope portion of the waveform, since, in this mode, this point represents the average DC value of signal 212. Output 222, 224 of acquisition circuit 220 is forwarded to multiplexer & buffer module 204, which decides whether to enable CCM or DCM, for example, in response to a top level control signal (not shown). Circuit 204 enables one of switch 230 or 232 depending on the mode of operation. In regular CCM operation, switch 230 is closed to connect the output of module 214 with output 250 via buffer 240. Conversely, in skip mode, switch 230 is open and switch 232 is closed, in order to engage multiplier circuit 216 prior to routing the signal to output 250 through paths 218 and 224.

Figure 4:
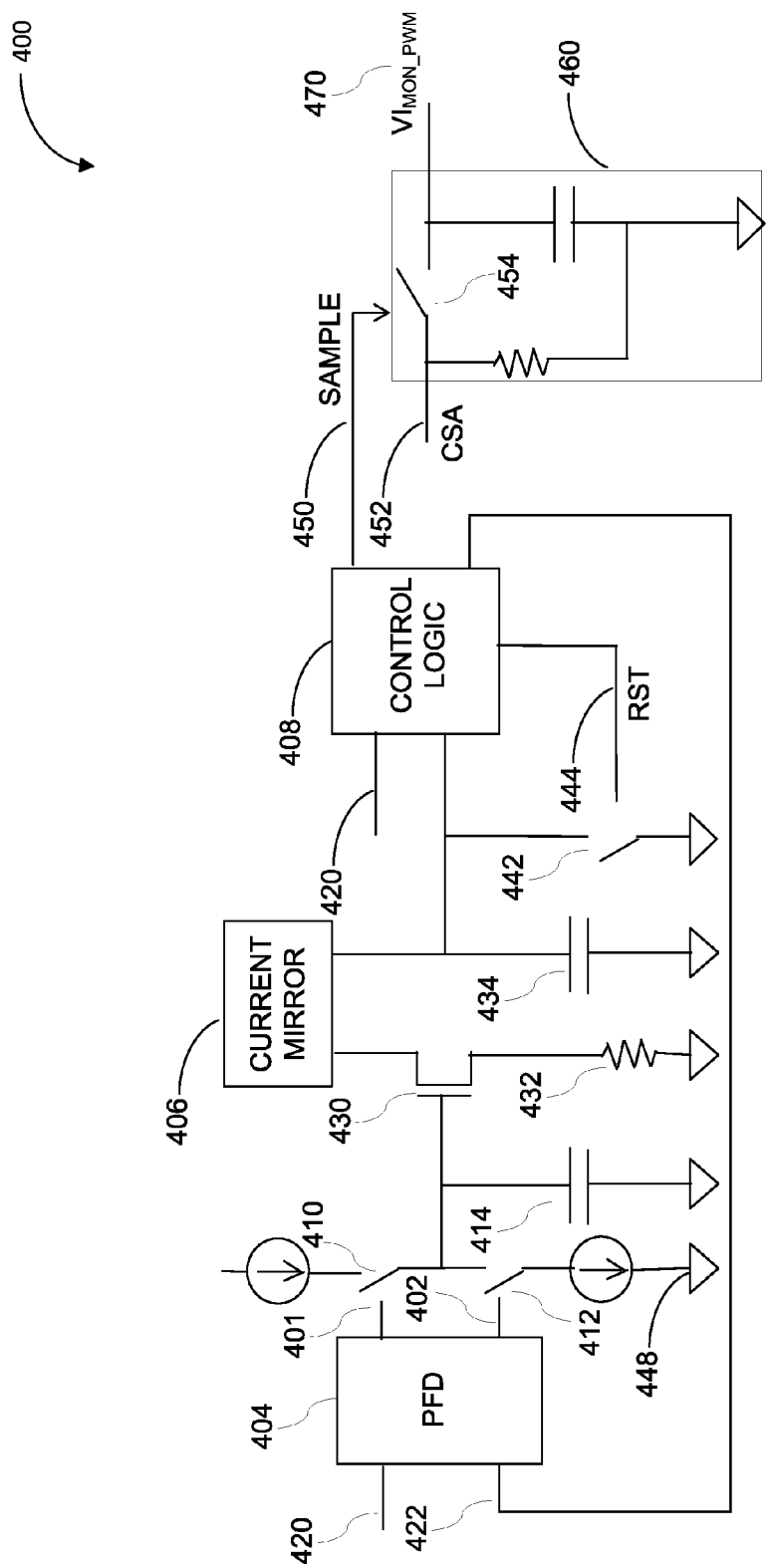
FIG. 4 is a schematic of an illustrative sample and hold circuit for use in a current monitor acquisition circuit according to various embodiments of the invention.

FIG. 4 is a schematic of an illustrative sample and hold circuit for use in a current monitor acquisition circuit according to various embodiments of the invention. As shown, sample and hold circuit 400 is a filtered circuit that comprises PFD 404, switch 410, 412, current monitor 406, control logic 408, transistor 430, and RC filter 460. PFD 404 may be any a phase frequency detector commonly used in PLL circuits. PFD 404 receives input signal 420, which is typically a top level turn-on signal, $SR_{ON}$, of a sensed power MOSFET, for example the gate signal of an n-MOS device (not shown). Input signal 420 comprises a predetermined waveform, for example, a pulse or a slope characterized by a rising and a falling edge. In one embodiment, input signal 420 is a turn-on voltage that timely overlaps with a sampled voltage that is generated by a CSA (not shown).

PFD 404 controls the DC voltage of capacitor 414 via switch 410, 412 and, by extension through current mirror 406, the voltage $V_{CAP}$ of capacitor 434. Current mirror 406 is any circuit known in the art. In this example, current mirror 406 generates a charge on capacitor 434. The charge rate is determined by the current through resistor 432, which is driven by and proportional to the voltage at capacitor 414 less the constant voltage $V_{GS}$ of transistor 430. Varying the voltage on capacitor 414 varies the voltage $V_{GS}$ of transistor 430. In effect, resistor 432 is a voltage driven current source that delivers charge to capacitor 434 proportional to the change and voltage of capacitor 414. In this example, transistor 430 is an NMOS transistor. Current mirror 406 is coupled to control logic 408, which is a digital logic circuit that will be described in more detail with respect to FIG. 5. Control logic 408 receives input signal 420 and capacitor voltage 434 and, in response, outputs reset signal 444, sample signal 450, and pulse voltage $V_{COMP}$ 422. RC filter 460, which comprises sampling switch 454, is configured to receive CSA voltage 452 and to output voltage 470.

PFD 404 controls the voltage $V_{CAP}$ at capacitor 434 to ramp up to a predetermined level prior to being grounded by switch 442 in response to receiving reset signal 444 RST. In one embodiment, the voltage $V_{CAP}$ at capacitor 434 is designed to ramp up two times during a pulse of input signal 420 and fall to a zero value in between the two ramping periods. Within the time that $V_{CAP}$ assumes a zero value, control logic 408 generates a sampling signal, in this example a sampling pulse, and aligns the center of the sampling signal with the center of the pulse of input signal 420. The width of the sampling pulse is chosen to be sufficiently narrow to be remote in time from the rising and falling edge of input signal 420, such that unwanted interference and noise associated with transients are avoided at the time input signal 420 is sampled.

Control logic 408 receives input signal 420 and $V_{CAP}$ and generates therefrom voltage pulse $V_{COMP}$ 422. In one embodiment, control logic 408 aligns the rising edge of $V_{COMP}$ with the rising edge of input signal 420. In contrast, control logic 408 aligns the falling edge of voltage pulse $V_{COMP}$ 422 with the falling edge of a voltage ramp in the $V_{CAP}$ waveform. The resulting voltage pulse $V_{COMP}$ 422 is fed back to PFD 404, which compares $V_{COMP}$ 422 with input signal 420, for example, to determine whether the falling edge of the voltage of capacitor 434 occurs prior to or after the falling edge of input signal 420. In other words, the falling edge of $V_{COMP}$ 422 serves as a reference for PFD 404 when determining whether a phase difference exists between a falling edge of capacitor voltage 434 and input signal 420, respectively.

Based on the phase difference, PFD 404 generates signal 401, 402 that serves as a correction signal to adjust $V_{CAP}$ in a manner, such that the phase difference is minimized. In one embodiment, the second falling edge of $V_{CAP}$ is adjusted by increasing or decreasing the ramping rate of $V_{CAP}$. The slope of $V_{CAP}$ is adjusted, for example, by adjusting the voltage at capacitor 434. For example, if the slope is too steep, i.e., the ramp rate is too high, PFD 404 adjusts $V_{CAP}$ by generating signal 402, which discharges capacitor 434 and, thus, decreases $V_{CAP}$ and the ramp rate. Conversely, if the ramp rate is too low, PFD 404 generates signal 401, which increases the capacitor voltage, the capacitor current, and ultimately the slope rate.

By varying the slope rate via signal 401, 402 the negative feedback loop constantly adjusts the location of the midpoint of the sample signal relative to input signal 420. Once the falling edge of $V_{CAP}$ is aligned with the falling edge of input signal 420, the center of the sample pulse will be aligned with input signal 420. In one embodiment, the slope of $V_{CAP}$ is held at a constant rate and triggering points of control circuit 408 are varied, for example, by configuring a reference signal with a control circuit 408 to track and adjust the position of a falling edge of $V_{CAP}$.

Using the sample pulse, control logic 408 samples voltage 452 at the CSA output, which is representative of the current flowing the switching converter. Sampled values are low-pass filtered and averaged by RC filter 460 to generate DC voltage 470 that is representative of the inductor current.

One of ordinary skill in the art will appreciate that signal 401, 402 may be clocked at the same rate as input signal 420 (e.g., 2 MHz). For example, by implementing an appropriate counter, PFD 404 may perform adjustments at each clock period or any other selected predefined clock period as desired. It is noted that signals 401, 402 may be clocked by the same clock as input signal 420 (e.g., 2 MHz). Comparisons may be performed, for example, at each clock period or any other selected predefine clock period, for example, by implementing an appropriate counter.

Figure 5:
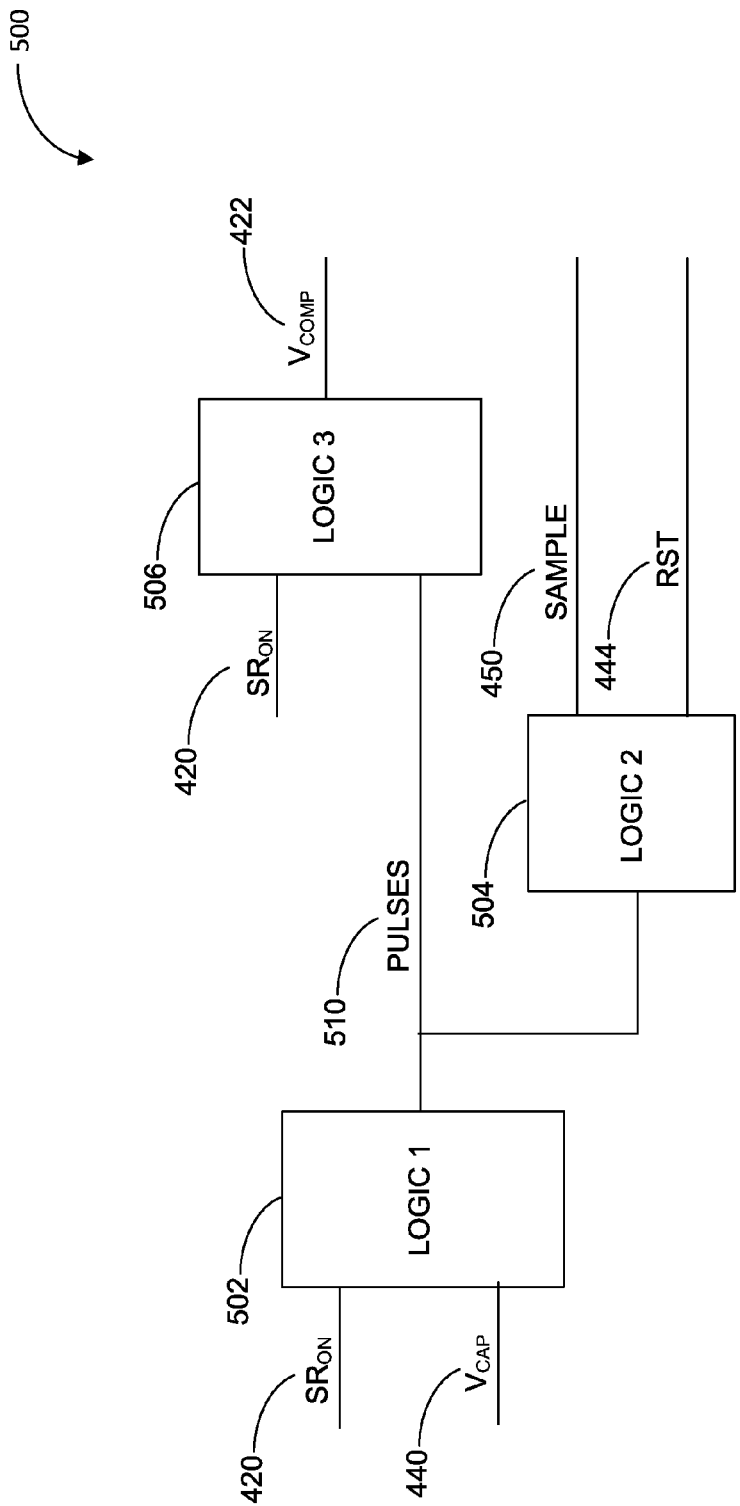
FIG. 5 is an exemplary block diagram of a control logic circuit used in the sample and hold circuit of FIG. 4, according to various embodiments of the invention.

FIG. 5 is an exemplary block diagram of a control logic circuit used in the sample and hold circuit of FIG. 4, according to various embodiments of the invention. Control logic 500 comprises logic modules 502-506, which are logic circuits that comprise digital components, including flip-flops, inverters, etc. Logic 1 502 has two input ports at which it receives signals $SR_{ON}$ 420 and $V_{CAP}$ 440, respectively.

The output port of logic 1 502 is coupled to inputs of both logic 2 504 and logic 3 506. Logic 2 504 has two output ports to generate sample pulse 450 and RST signal 444. Logic 3 506 is coupled to receive signals 420 and 510 and output signal $V_{COMP}$ 422.

In operation, circuit 500 generates sample pulse 450, for example, in response to sensing a turn-on signal of a FET during a start-up operation. Logic circuit 500 further generates pulse signal, $V_{COMP}$ 422, whose falling edge is related to the position of sample pulse 450. In detail, logic 1 502 generates pulses 510 of a predetermined width during a dead time between pulses within signal $V_{CAP}$ 440. Logic 2 504 serves to eliminate one or more pulses from the output of logic 1 502. As a result, logic 2 504 outputs as sample pulse 450 only one of two pulses received from logic 1 502. In addition, logic 2 504 generates reset signal 444. Logic 3 506 combines signal $SR_{ON}$ 420 with the output of logic 1 502 to generate signal $V_{COMP}$ 422. The rising edge of $SR_{ON}$ 420 generates the rising edge of signal $V_{COMP}$ 422, for example using a D flip-flop, while the rising edge of the second pulse in signal 510 generates the falling edge of signal $V_{COMP}$ 422. As previously mentioned, the falling edge of $V_{COMP}$ 422 can be used as a reference signal in order to determine whether a phase difference exists between $V_{CAP}$ 440 and $SR_{ON}$ 420.

Figure 6:
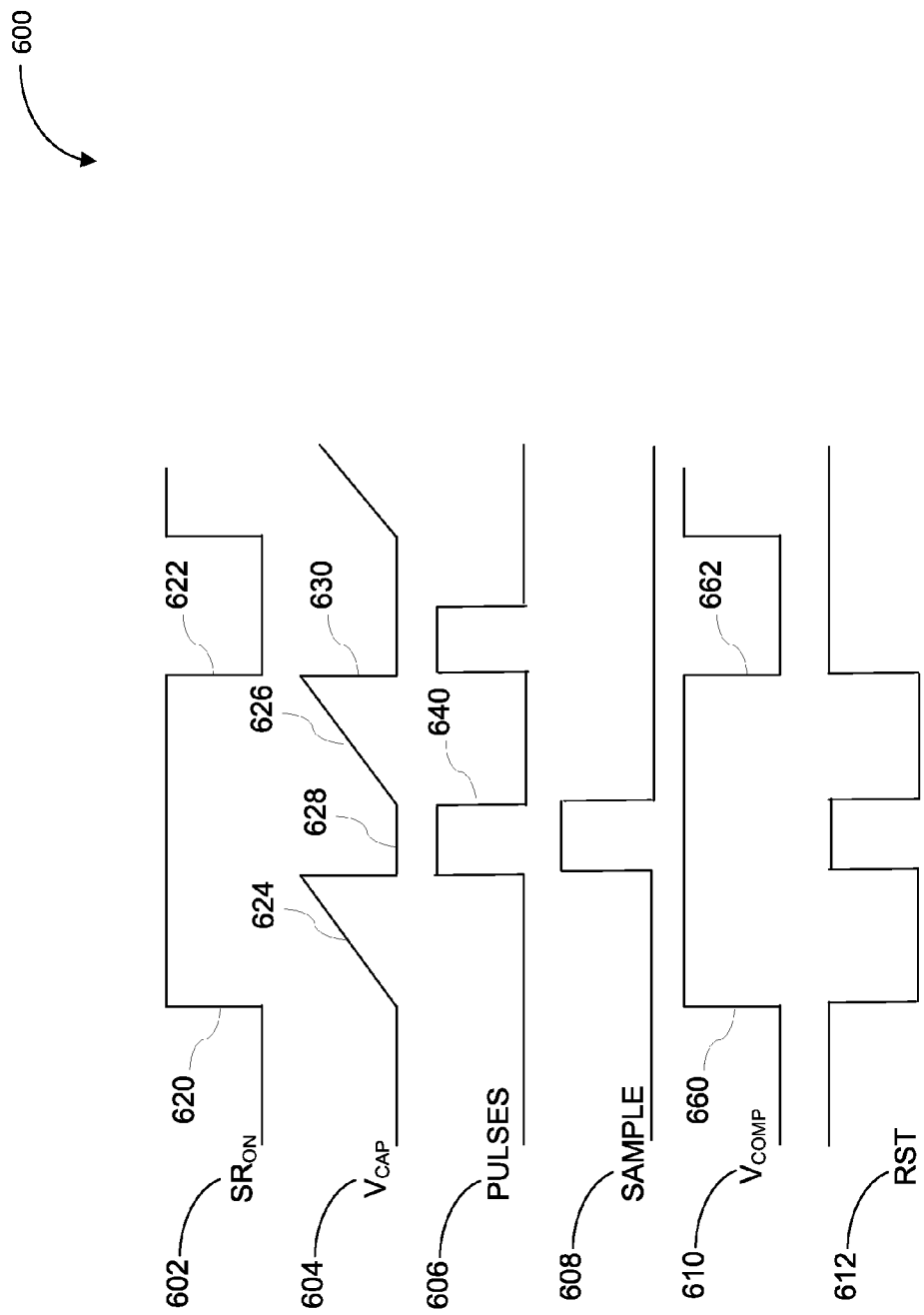
FIG. 6 illustrates an exemplary timing diagram for the control logic circuit in FIG. 5, according to various embodiments of the invention.

FIG. 6 illustrates an exemplary timing diagram for the control logic circuit in FIG. 5, according to various embodiments of the invention. Signals 602-612 correspond to signals shown in FIG. 5. In this example, signal $SR_{ON}$ 602 is a pulse signal that represents the time a current flows through an inductive element of a switching regulator. The midpoint of pulse 602 correlates to the midpoint of a current signal that causes a current to flow through a low-side power FET, which is sampled by the sample and hold circuit of FIG. 4.

Signal $V_{CAP}$ 604 comprises a series of voltage ramp waveforms that have identical ramp rates. Signal $V_{CAP}$ 604 may be present at a charge pump device or a capacitor and, in one embodiment, may comprise first triangular pulse 624 and second triangular pulse 626 with dead time 628 located between the falling edge of first triangular pulse 624 and the rising of second triangular pulse 626. During dead time 628, sample pulse 608 is created, for example, by generating pulses 606, at falling edges of signal 604.

In one embodiment, signal $V_{CAP}$ 604 is locked to signal $SR_{ON}$ 602 by aligning falling edge 630 of pulse 626 with falling edge 622 of signal $SR_{ON}$ 602. As a result, dead time 628 will be centered between ramping signals 624 and 626. In other words, the middle of sample pulse 608 will be located in the middle of the section of signal $SR_{ON}$ 602 that is defined by rising and falling edges 620 and 622.

In one embodiment, the slope of $V_{CAP}$ 604 is controlled by voltage signals (not shown) that control the amount of current flowing onto a capacitor at which signal $V_{CAP}$ 604 is present. By adjusting the slope, the location of dead time 628 during which sample pulse 608 occurs can be adjusted. As a result, the width of sample pulse 608 and its position relative to signal $SR_{ON}$ 602 may be adjusted such that the center of sample pulse 608 is aligned with the center of signal $SR_{ON}$ 602. Therefore, by aligning the falling edges of signal $SR_{ON}$ 602 and signal $V_{CAP}$ 604, the midpoints of signal $SR_{ON}$ 602 and sample pulse 608 can be aligned to be the same, such that sample pulse 608 can be used to sample a signal that occurs in the middle of signal $SR_{ON}$ 602.

In one embodiment, the width of sample pulse 608 and its position relative to signal $SR_{ON}$ 602 is adjusted by keeping the slope of $V_{CAP}$ 604 constant while adjusting the triggering point of falling edge 630 via a control circuit.

Note that changes in input and output voltage will typically change the width of the sample window, because signal $SR_{ON}$ 602 is a function of the input and output voltage rather than a fixed quantity and may change at transitions between CCM and DCM. Although ideally the width of sample pulse 608 would be as wide as possible to allow for fast sampling, in practice, the variability of signal $SR_{ON}$ 602 the window width should be appropriately narrowed. A narrower window has the additional benefit of aiding in avoiding the inadvertent sampling of noisy signals caused by rapid rise and fall times of signals.

Figure 7:
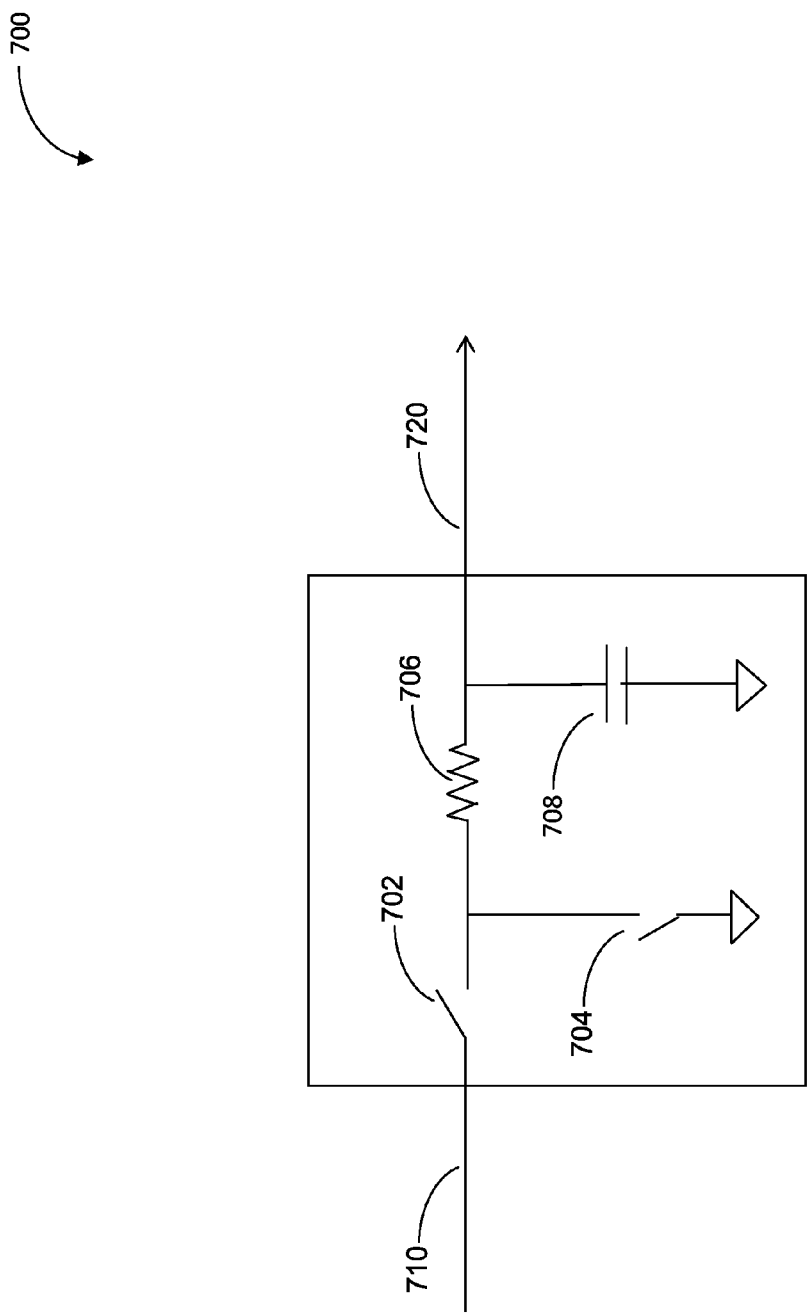
FIG. 7 illustrates an exemplary multiplier circuit for use in the current monitoring system in FIG. 2, according to various embodiments of the invention.

FIG. 7 illustrates an exemplary multiplier circuit for use in the current monitoring system in FIG. 2, according to various embodiments of the invention. Multiplier circuit 700 comprises switches 702 and 704, resistor 706, and capacitor 708, which together form a buck converter that comprises an RC filter rather than the typical LC filter. This is made possible because circuit 700 is implemented in the signal path rather than in a power path. Using an RC filter has the advantage that it is smaller than an LC filter.

In operation, multiplier 700 receives a sampled, averaged DC signal 710, in this example, a sampled CSA signal and converts it into output signal 720. Output signal 720 is a DC signal that, in CCM, represents an average inductor current. In DCM, output signal 720 is first scaled, for example, by division with a predetermined factor less than 1. In one embodiment, the factor is 1 for CCM and $(T_{on}+T_{off})/T_s$ for DCM. As a result, output signal 720 will correctly represent the DC component of the CSA output, thereby, allowing for the precise monitoring of current in DCM. Output signal 720 is then forwarded, for example, to a following ADC stage.

Multiplier circuit 700 may be implemented as analog multiplier circuit. In one embodiment, switches 702 and 704 are p-MOS and n-MOS devices, respectively. However, one of ordinary skill in the art will appreciate that any type of switch may be used. In particular, in applications where the signal input range of signal 710 is wide, T-gate devices having a low gate resistance may be implemented, in order to ensure that the switch always turn on when needed without having to rely on the voltage being sufficiently high for the switch to reach its minimum required threshold voltage.

Figure 8:
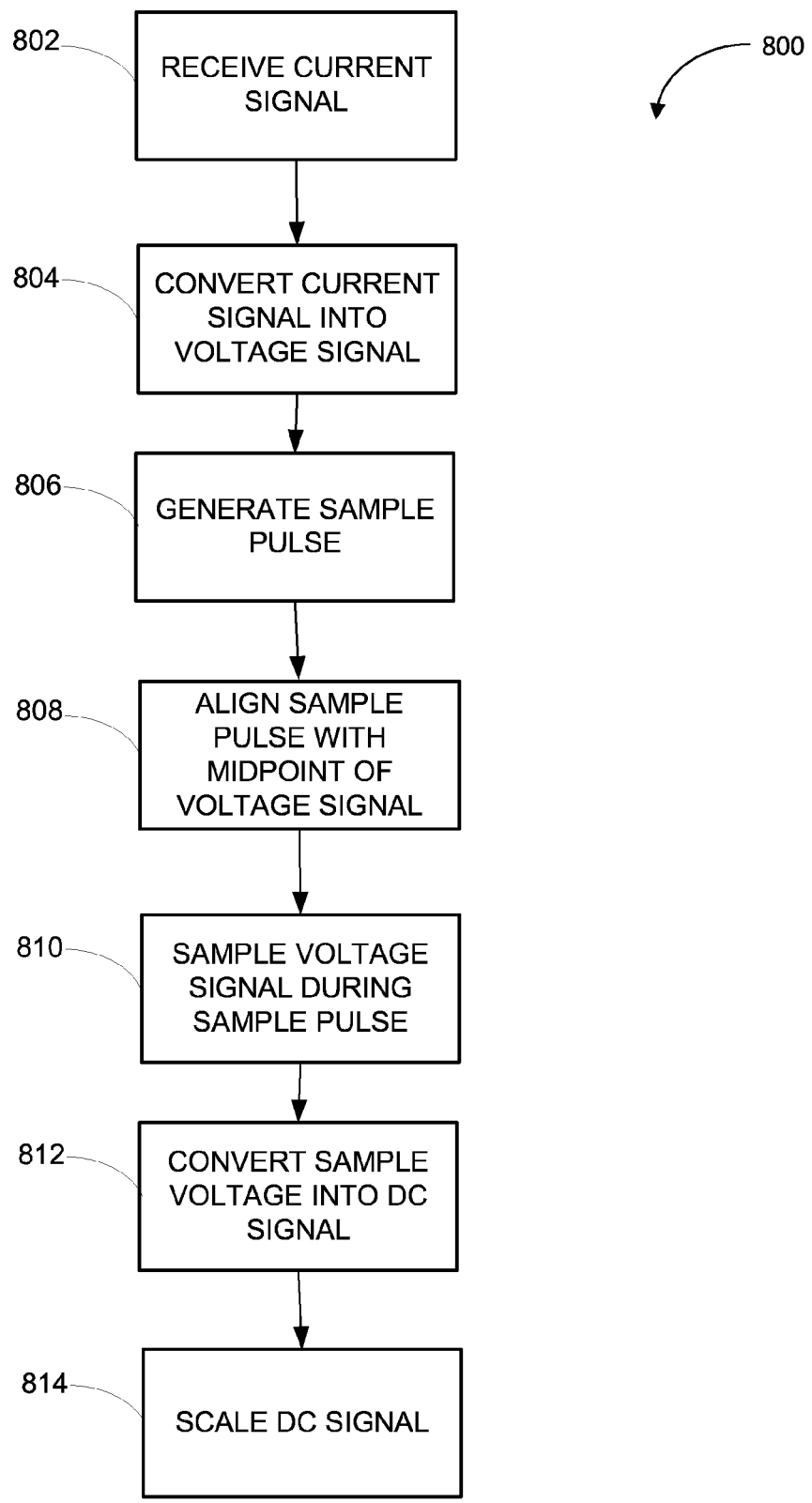
FIG. 8 is a flowchart of an illustrative process for current monitoring in accordance with various embodiments of the invention.

FIG. 8 is a flowchart of an illustrative process for current monitoring in accordance with various embodiments of the invention. At step 802, a current signal is received, for example, from a synchronous buck rectifier.

At step 804, the current signal is converted into a voltage signal, for example, a voltage signal that is proportional to the current signal.

At step 806, a sample pulse is generated to sample a midpoint of at least one section of the voltage signal, e.g., a ramp-down section.

At step 808, the sample pulse is aligned with the midpoint. Aligning may be accomplished by lining up a falling edge of a voltage pulse with the falling edge of a voltage ramp, for example, by employing a closed feedback loop configuration.

At step 810, the voltage signal is sampled during the sample pulse.

At step 812, the sampled voltage signal is converted into a DC signal that represents a current, for example, by averaging and filtering the sampled voltage signal.

At step 814, the DC signal is scaled, for example, by multiplying it with a predetermined factor, which is advantageous for skip mode operation. In one embodiment, the factor for skip mode operation is proportional to ($T_{ON}$+

$T_{OFF}/T_S$, and may be determined from the on time of a high-side or low-side power FET.

In one embodiment, the voltage pulse is related to the sample pulse in that if the falling edge of the voltage pulse is aligned with the falling edge of the voltage signal, the sample pulse will be aligned with the midpoint of the voltage signal or at least one section thereof.

In one embodiment, aligning is enabled via a feedback configuration that minimizes a phase difference between the falling edges of the voltage pulse and the voltage signal by adjusting the voltage of a charge pump capacitor. The capacitor voltage, in turn, determines the location and, thus, the midpoint of the sample window.

It will be appreciated by those skilled in the art that fewer or additional steps may be incorporated with the steps illustrated herein without departing from the scope of the invention. No particular order is implied by the arrangement of blocks within the flowchart or the description herein.

It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. An acquisition circuit to monitor current in a switching converter comprising:
   a first capacitor having a first voltage;
   a phase frequency detector (PFD) coupled to the first capacitor, the PFD receives a first input signal and a feedback signal to generate a first control signal to adjust the first voltage based on the feedback signal; and
   a control logic coupled to the first capacitor, the control logic generates the feedback signal based on a comparison of the first voltage and the first input signal, the control logic further generates a sample signal when the first voltage has a zero slope.

2. The circuit according to claim 1, wherein the control logic comprises circuitry to detect a phase difference between the first voltage and the first input signal.

3. The circuit according to claim 1, wherein the control logic comprises a pulse generation circuit that generates one or more pulse signals.

4. The circuit according to claim 3, wherein the control logic comprises circuitry to generate the sample signal by suppressing at least of the one or more pulse signals.

5. The circuit according to claim 4, wherein the sample signal is relatively narrower than the first input signal.

6. The circuit according to claim 1, wherein the first capacitor is coupled to a current mirror and a second capacitor, the current mirror comprises:
   a resistor carrying a resistor current that is generated by the second capacitor; and
   a transistor coupled between the resistor and the second capacitor, the current mirror generates on the first capacitor a charge having a charge rate that is determined by the resistor current and a transistor voltage.

7. The circuit according to claim 1, wherein the first input signal is a drive signal that cycles a switch on and off.

8. The circuit according to claim 7, wherein the switch operates as a buck synchronous rectifier.

9. The circuit according to claim 1, wherein the PFD is configured to generate the first control signal in response to detecting a phase difference between the first voltage and the first input signal.

10. A system to monitor current in a multimode switching converter, the system comprising:
    a current sense amplifier providing a first voltage representative of an inductor current;
    an acquisition circuit coupled to the current sense amplifier, the acquisition circuit comprising:
       a first capacitor having a second voltage;
       a PFD coupled to the first capacitor, the PFD receives a first input signal and a feedback signal to generate a first control signal to adjust the second voltage; and
       a control logic coupled to the first capacitor, the control logic generates the feedback signal based on a comparison of the second voltage and the first input signal, the control logic further generates a sample signal that is related to the first input signal; and
    a multiplexer and buffer module coupled to the acquisition circuit, the multiplexer and buffer module determines a mode of operation based on a second control signal.

11. The circuit according to claim 10, wherein the acquisition circuit comprises a low-pass filter network that samples the first voltage in response to receiving the sample signal.

12. The system according to claim 10, wherein the PFD is configured generate the first control signal in response to detecting a phase difference between the second voltage and the first input signal.

13. The system according to claim 12, wherein the PFD comprises a closed loop feedback network to minimize the phase difference by adjusting the second voltage.

14. The system according to claim 10, wherein the current sense amplifier is configured to operate in skip mode.

15. The system according to claim 14, wherein the acquisition circuit comprises a multiplier circuit to scale a sampled current signal by a factor proportional to $(T_{ON}+T_{OFF})/T_S$, wherein $T_{ON}$ represents a high-side power FET on time, $T_{OFF}$ low-side power FET on time, and $T_S$ represents a period.

16. A method to monitor current in a switching converter, the method comprising:
    receiving at a phase frequency detector a first input signal and a second input signal, the second input signal being fed back by a control logic;
    using control logic coupled to the phase frequency detector to generate a first control signal to adjust a ramp voltage based on a signal output from the phase frequency detector, the feedback signal being generated in response to determining a phase difference between the ramp voltage and the first input signal;
    using the control logic to generate a sample pulse that defines a time at which to sample a current signal;
    aligning the sample pulse with the first input signal; and
    sampling the current signal.

17. The method according to claim 16, further comprising aligning a falling edge of the feedback signal with a falling edge of the ramp voltage.

18. The method according to claim 16, wherein the sample pulse is generated when the ramp voltage has a zero slope.

19. The method according to claim 16, further comprising:
   receiving the current signal;
   sampling the voltage signal during the sample pulse; and
   converting the current signal to a voltage signal.

20. The method according to claim 16, further comprising outputting a scaled output signal representative of the sampled current signal.

* * * * *